United States Patent
Wang

(10) Patent No.: US 9,214,465 B2
(45) Date of Patent: Dec. 15, 2015

(54) STRUCTURES AND OPERATIONAL METHODS OF NON-VOLATILE DYNAMIC RANDOM ACCESS MEMORY DEVICES

(75) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 656 days.

(21) Appl. No.: 13/557,145

(22) Filed: Jul. 24, 2012

(65) Prior Publication Data

US 2014/0029340 A1 Jan. 30, 2014

(51) Int. Cl.
*G11C 14/00* (2006.01)
*H01L 27/105* (2006.01)
*H01L 27/108* (2006.01)
*H01L 27/115* (2006.01)

(52) U.S. Cl.
CPC .......... *H01L 27/105* (2013.01); *G11C 14/0018* (2013.01); *H01L 27/108* (2013.01); *H01L 27/115* (2013.01)

(58) Field of Classification Search
CPC .......... G11C 16/0416; G11C 2216/10; G11C 16/0425
USPC .................. 365/185.08, 185.05
See application file for complete search history.

(56) References Cited

U.S. PATENT DOCUMENTS

| | | | |
|---|---|---|---|
| 3,916,390 A | 10/1975 | Chang | |
| 4,005,837 A | 2/1977 | Grundy | |
| 4,055,837 A | 10/1977 | Stein et al. | |
| 4,471,471 A | 9/1984 | DiMaria | |
| 5,331,188 A | 7/1994 | Acovic | |
| 5,677,867 A * | 10/1997 | Hazani | 365/185.01 |
| 6,009,011 A * | 12/1999 | Yamauchi | 365/185.01 |
| 6,331,947 B1 * | 12/2001 | Widdershoven et al. | 365/185.08 |
| 6,952,366 B2 | 10/2005 | Forbes | |
| 6,996,007 B2 | 2/2006 | Ahn | |
| 7,054,201 B2 | 5/2006 | Ahn | |
| 7,072,213 B2 | 7/2006 | Forbes | |
| 7,099,181 B2 | 8/2006 | Ahn | |
| 7,224,609 B2 | 5/2007 | Ahn | |
| 7,319,613 B2 | 1/2008 | Forbes | |
| 7,733,700 B2 | 6/2010 | Wang | |
| 2003/0137892 A1* | 7/2003 | Arimoto et al. | 365/230.03 |
| 2010/0195415 A1* | 8/2010 | Seko | 365/189.09 |
| 2011/0116316 A1* | 5/2011 | Ueda | 365/185.15 |

* cited by examiner

*Primary Examiner* — Tuan T Nguyen
(74) *Attorney, Agent, or Firm* — Muncy, Geissler, Olds & Lowe, P.C.

(57) ABSTRACT

A Dynamic Random Access Memory (DRAM) cell and a semiconductor Non-Volatile Memory (NVM) cell are incorporated into a single Non-Volatile Dynamic Random Access Memory (NVDRAM) cell. The NVDRAM cell is operated as the conventional DRAM cell for read, write, and refreshment on dynamic memory applications. Meanwhile the datum in the NVM cells can be directly loaded into the correspondent DRAM cells in the NVDRAM cell array without applying intermediate data amplification and buffering leading to high speed non-volatile data access. The datum in DRAM cells can be also stored back to the correspondent semiconductor NVM cells in the NVDRAM cells for the datum required for non-volatile data storage. The NVDRAM of the invention can provide both fast read/write function for dynamic memory and non-volatile memory storage in one unit memory cell.

25 Claims, 11 Drawing Sheets datum "1" stored in cell 205

Cell 205 with high threshold voltage datum "0" stored in cell 205

Cell 205 with low threshold voltage

NVM cell is programmed to a high threshold voltage state when DRAM cell stores a datum "1"

No programming occurs and NVM cell remains in low threshold voltage state when DRAM cell stores a datum "0"

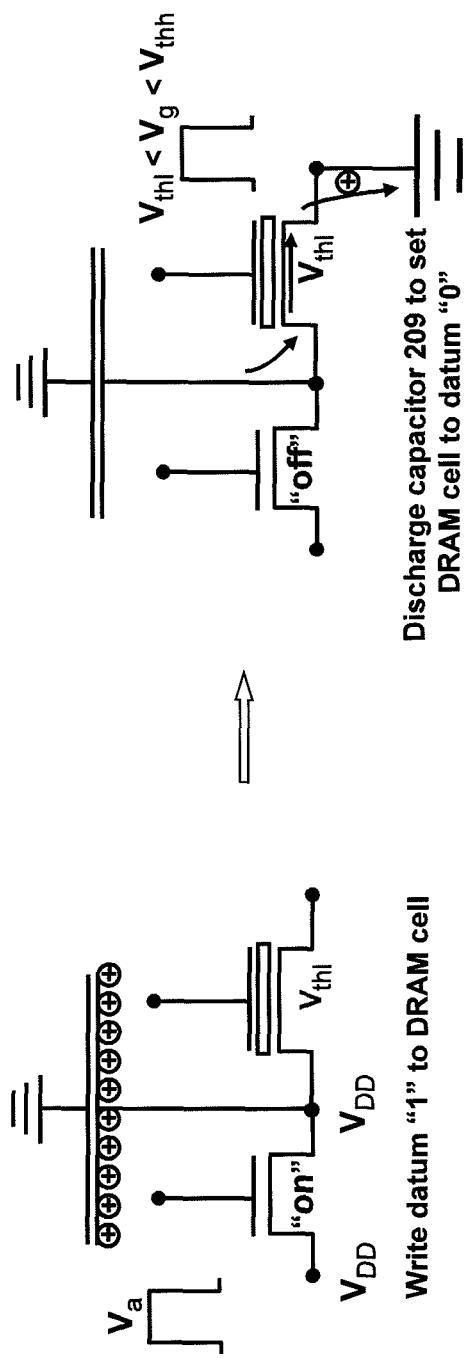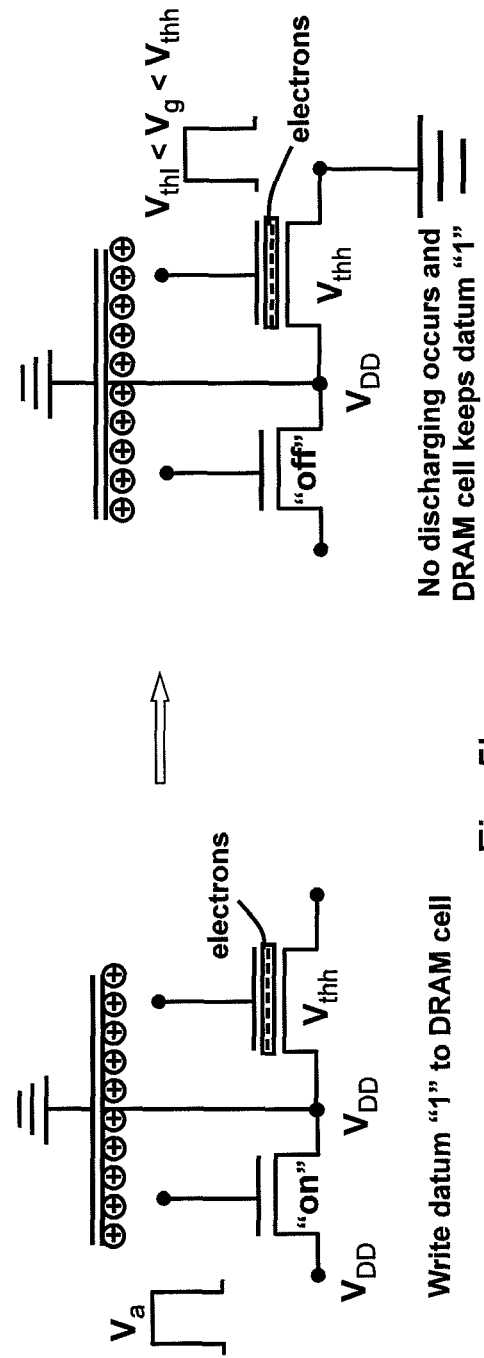
Fig. 5a
Fig. 5b

STRUCTURES AND OPERATIONAL METHODS OF NON-VOLATILE DYNAMIC RANDOM ACCESS MEMORY DEVICES

BACKGROUND OF THE INVENTION

1. Field of the invention

This invention relates to Non-Volatile Dynamic Random Access Memory (NVDRAM) and the methods of operations. In particular, a semiconductor NVM cell and a conventional DRAM cell are incorporated to form a single NVDRAM cell. The NVDRAM cell configuration of the invention is capable of separating the low voltage operation of DRAM and high voltage operation of semiconductor NVM. Thus, the operations of the NVDRAM cells of the invention are also simplified and various voltage powers can be turned on and off according to the operational modes for lowering chip power consumption. The NVDRAM cell of the invention has read/write speed of the conventional DRAM with non-volatile memory capability as well.

2. Description of the Related Art

Semiconductor memories have been broadly applied to electronic systems. Electronic systems require semiconductor memories for storing instructions and datum from the basic functions of controls to the complex computing processes. Semiconductor memories can be categorized into volatile memories and non-volatile memories. The volatile memories including Static Random Access Memory (SRAM) and Dynamic Random Access Memory (DRAM) lose their stored datum after the memory's powers are turned off. While the semiconductor non-volatile memories such as Read Only Memory (ROM), Electrical Erasable Programmable Read Only Memory (EEPROM) and flash still keep their stored datum even without the memory power.

In areas of electronic system applications, DRAM has become the memory of choice for storing large datum due to its high read/write speed, high density, and low cost. An active electronic system applies the datum from DRAM for instruction execution and information inputs and stores back the new datum to DRAM for further operations. In addition, when the power for an electronic system is turned on, the system would require having initial datum for instructions and information to operate. The initial datum is usually stored in a non-volatile memory device. An electronic system has to move the initial instruction and datum from a non-volatile memory device to a DRAM device before entering the system normal operations. The datum moving from a non-volatile memory device to a DRAM device has always occupied a major wait time for booting up an electronic system. On the other hand, for turning off electronic systems or power interruptions by a failure or a glitch, some critical datum in DRAM device can not be lost and need to be stored back to a non-volatile device for the use of next power-on. Thus, it shall be very desirable for electronic system memory applications to integrate an NVDRAM device capable of having the function of DRAM and the function of recalling and storing non-volatile datum.

In the development of NVDRAM, transferring charges between the storage node of DRAM capacitor and the charge storing material of a semiconductor non-volatile memory has been the main focus. For example, U.S. Pat. No. 3,916,390 to J. J. Chang et al. discloses a cell structure similar to the split-gate MNOS (Metal Nitride Oxide Semiconductor) non-volatile memory for backing up dynamic memory for a power failure (schematic shown in FIG. 1a); U.S. Pat. No. 4,055,837 to K. U. Stein applies the structure of Electrical Erasable Programmable Read Only Memory EEPROM (the schematic of one P-type access transistor and one non-volatile storage node as shown in FIG. 1b); U.S. Pat. No. 4,471,471 to D. J. DiMaria applies silicon-rich Double Electron Injection Structure (DEIS) stack to inject electrons to floating gate for non-volatile programming before the thin tunneling oxide become available (FIG. 1c); U.S. Pat. No. 5,331,188 to Acovic et al. applies three ploy-silicon layers for DEIS, and a thin tunneling oxide in between the first poly-silicon and the heavy doped P-type diffusion as the Single Electron Injection Stack (SEIS) for transferring charges between the floating gate and capacitor storage node (FIG. 1d).

As the oxide growth process has been improving reliable thin tunneling oxides required for transferring charges in-out of the charge storing material while maintaining the stored charges non-volatile become easily available for semiconductor non-volatile memory. In recent development of NVDRAM, U.S. Pat. No. 6,952,366, No. 7,072,213, and No. 7,319,613 to Forbes apply a Nitride Read Only Memory (NROM) cell for access transistor, and a storing capacitor (FIG. 1e); U.S. Pat. Nos. 6,996,007, 7,054,201, 7,099,181, and 7,224,609 to Ahn et al. apply nitride film and floating gate non-volatile memory cell for the access transistor, and a storing capacitor (FIG. 1f). Both NVDRAM approaches have achieved the most cell compactness of 1T1C (one transistor and one capacitor) configuration as that of conventional DRAM cell. Although the 1T1C configuration is the most compact form of NVDRAM cell the non-volatile access transistor, unlike the access transistor of the conventional DRAM cell, requires high voltage to operate not only for the charge transfer tunneling operations but also for accessing the capacitor storage node. Furthermore, since the thick film stacks from the control gate to the channel of a non-volatile Metal Oxide Semiconductor Field Effect Transistor (MOSFET) consist of coupling dielectrics, a layer of charge storing materials such as floating gate, nitride dielectrics, or nanocrystals, and a layer of tunneling oxide between ~100 to ~80 angstroms thick, the driving transistor performance of non-volatile MOSFET is much inferior to that of MOSFET (oxide thickness ~30 angstroms) applied for the access transistors in modern DRAM. In dynamic memory mode the above mentioned 1T1C NVDRAM would have slower read/write access performance and require applying a higher gate voltage to access the capacitor storage node. The high voltage access also results in higher power consumption and longer switching time to turn on/off the access transistors for the dynamic memory read/write operations in comparison with the modern DRAM. Substitution of the access transistor for non-volatile MOSFET would sacrifice the performance of modern DRAM for speed and power consumption. In addition, for programming the 1T1C NVDRAM, the high voltage applied at the drain electrode of the non-volatile MOSFET connected to the storage capacitor may exceed the maximum dielectric field strength of the storage capacitor designed for low voltage operation in modern DRAM. This constraint has lead to more complicated and less efficient tedious programming schemes as disclosed in Forbes and Ahn.

In order to simplify the programming/erase operations for the non-volatile memory but not to compromise the DRAM performance of the low voltage operations, we have disclosed a new 2T1C (one non-volatile transistor+one access transistor+one storage capacitor) NVDRAM to operate exactly the same as DRAM for the random dynamic memory applications and to have the capability of fast recalling and storing non-volatile memory datum as well.

SUMMARY OF THE INVENTION

The schematic of an NVDRAM cell 200 shown in FIG. 2 consists of a DRAM cell (201 and 209) and a semiconductor NVM cell 205. As the standard DRAM configuration, the access transistor 201 is a low voltage MOSFET with gate electrode 203, source electrode 202, and drain electrode 204a, and the storage capacitor 209 has a capacitor electrode 204c and a common plate electrode 210. The non-volatile MOSFET 205 has control gate electrode 208, source electrode 206, substrate electrode 211, and drain electrode 204b, with charge storing material 207 such as poly floating gate, nitride dielectric, and nano-crystals sandwiched in between the control gate electrode 208 and channel. The drain electrode 204a of the access MOSFET 201, the drain electrode 204b of the non-volatile MOSFET 205, and the capacitor node 204c of the storage capacitor 209 are connected together to form a single charge storage node 204. In dynamic memory operation, the non-volatile MOSFET 205 having its control gate 208 applied with ground voltage is "off". The read, write, and refreshment operations are the same as those in conventional DRAM. As illustrated in FIG. 3a, two digital data of "1" and "0" are represent by the "high" and "low" voltage potentials of $V_{DD}$ and $V_{SS}$ at the storage node 204, respectively, where $V_{DD}$ and $V_{SS}$ are the positive voltage and ground voltage of the DRAM operation power rail. For the reasons of saving power and reliability of thin capacitor dielectrics, a conventional DRAM usually runs the positive voltage $V_{DD}$ below 3 volts. The positive voltage power rail for most common DRAM is 1.8 volts and trends to improve to an even lower operating voltage. Since the operations of DRAM are well known to people in the skills we will not address in more details. Note that depending on the various DRAM read schemes, the common plate electrode 210 is either connected to a ground voltage or half of the low operating voltage (i.e., $V_{DD}/2$) as the conventional DRAM cells operate.

The non-volatile datum is stored by modulating non-volatile MOSFET threshold voltage through the injection of charge carriers from the channel into the charge storing material 207. For example, by injecting electrons to the charge storing material 207 of non-volatile MOSFET 205, the threshold voltage of non-volatile MOSFET 205 is shifted to a higher threshold voltage. When a gate voltage $V_g$, where $V_{thl} < V_g < V_{thh}$, is applied to the control gates 208 of the non-volatile MOSFETs 205, the non-volatile MOSFETs 205 with high threshold voltage $V_{thh}$, can be turned "off", and the non-volatile MOSFETs 205 with low threshold voltage $V_{thl}$ can be turned "on", respectively. As illustrate in FIGS. 3b and 3c, the non-volatile datum of "1" and "0" are represented by the two states of "high" and "low" threshold voltages, $V_{thh}$ and $V_{thl}$ of the non-volatile MOSFET 205, respectively. Thus, with the gate voltage $V_g$ applied to the control gates 208 of non-volatile MOSFETs 205, the "on" and "off" responses of the non-volatile MOSFETs 205 determine the non-volatile digital data of "0" and "1", respectively.

Before the non-volatile MOSFET 205 is ready for storage, the non-volatile MOSFET 205 is erased to a lower threshold voltage $V_{thl}$. The conventional channel Fowler-Nordheim tunneling method can be used to erase the non-volatile NMOSFET 205 by applying a high voltage field between the control gate electrode 208 and the substrate electrode 211 to tunnel the stored electrons out of the charge storing material 207. Or the stored electrons in the charge storing material 207 can be annihilated by the band-to-band hot hole injection facilitated by the reversed source/drain junction voltage bias.

In non-volatile storage mode, the data in DRAM cell (201 and 209) is required to store back to its correspondent non-volatile MOSFET 205 by programming the non-volatile MOSFET 205. The programming scheme disclosed in U.S. Pat. No. 7,733,700 B2 (the disclosure of which is incorporated herein by reference in its entirety) to Lee Wang applies a reversed junction voltage bias at the source electrode and $V_{DD}$ to the drain electrode of non-volatile MOSFET. To generate the reversed source junction bias in the programming, the source voltage bias $V_s$ and a negative voltage bias $V_{sub}$ are applied to the source electrode 206 and the substrate electrode 211 of the non-volatile MOSFET 205, respectively. The source voltage bias $V_s$ can be the ground voltage $V_{SS}$ by adjusting the negative voltage bias $V_{sub}$ to obtain the best programming efficiency. The voltage bias at the drain electrode 204b of the non-volatile MOSFET 205 is either $V_{DD}$ or ground voltage $V_{SS}$ for the DRAM data of "1" or "0". The access transistor 201 is turned on by applying a gate voltage $V_s$ to its gate electrode 203 such that the voltage bias at the storage node 204 is supplied with external voltages of $V_{DD}$ or $V_{SS}$ at source electrode 202 attached to a metal bitline from external read/refreshment circuitries as illustrated in FIGS. 4a and 4b, respectively. The external voltages of $V_{DD}$ or $V_{SS}$ can sustain the voltage bias at the storage node 204 during programming, where the programming current tends to pull down the voltage potential at the storage node 204. When a high voltage pulse with amplitude $V_{gh}$ is applied to the control gate 208 of the non-volatile MOSFET 205 for several μs, the non-volatile MOSFET 205 with drain voltage bias $V_{DD}$ generates hot electrons injected to the charge storing material 207 near the drain depletion regions as illustrate in FIG. 4a. The non-volatile MOSFET 205 with drain voltage bias $V_{DD}$ is programmed to a high threshold voltage $V_{thh}$ from the erased threshold voltage of $V_{thl}$. On the other hand, since the non-volatile MOSFET with drain voltage bias $V_{SS}$ equal to source voltage bias $V_{SS}$ is turned on in the deep linear mode region of a MOSFET, no hot carriers can be generated in the linear mode region resulting in no injection of hot electrons into the charge storing material as illustrate in FIG. 4b. The threshold voltage of the correspondent non-volatile MOSFET with the voltage potential $V_{SS}$ at the storage node 204 remains at the low erased threshold voltage $V_{thl}$. The correspondent non-volatile MOSFET 205 are programmed to the high threshold voltage $V_{thh}$ only for the storage node having a voltage potential of $V_{DD}$, where a DRAM cell stores a digital "1". Also note that as the concept applied in the prior arts the charge transferring between the storage node and the charge storing material in the correspondent non-volatile MOSFET never occurs during the entire programming non-volatile MOSFET process. The injection of hot electrons for programming non-volatile MOSFET is the same as that applied in NVM programming.

For recalling the non-volatile datum, the non-volatile MOSFET loads its non-volatile data to the correspondent DRAM's storage node 204. In the non-volatile data loading procedure, the entire DRAM cells are first written with "1" by charging the cells' storage nodes 204 to $V_{DD}$. As known in the DRAM operation, the stored charges at the storage node 204 after turning off the access transistor 201 gradually discharge through all possible leakage current paths. Refreshment of DRAM is required to prevent the permanent loss of memory datum. In modern DRAM specification, the refresh time must be longer than several hundreds to tens milliseconds. The following procedures of loading sequence are completed within the time orders of nanoseconds much shorter than the DRAM refresh time according to the invention. As referred to FIG. 5a, right after the storage capacitor 209 has been charged and the access transistor 201 is "off", a control gate voltage $V_g$, where $V_{thl} < V_g < V_{thh}$, is applied to the control gate 208 of the non-volatile MOSFET 205 with the source electrode biased to the ground voltage. Consequently the non-volatile MOSEFETs with low threshold voltage $V_{thl}$ are turned "on" to discharge the storage node voltage potential $V_{DD}$ to the ground voltage within a time order of nanoseconds or less while the non-volatile MOSEFETs with high threshold voltage $V_{thh}$ remain "off" for retaining the voltage potential $V_{DD}$ at the storage nodes 204 during the discharging period. When the storage capacitor discharging process is completed, the control gate 208 of the non-volatile MOSFET 205 is set to ground voltage. The ground voltage bias to the source electrode 204 and gate electrode 208 of the non-volatile MOSFET 205 can be disconnected to fully deactivate the non-volatile MOSFET 205. In the end of the "loading" operation, the datum stored in the DRAM cells are the direct images of the non-volatile datum in the correspondent non-volatile MOSFETs, that is, "1" for the high threshold voltage and "0" for low threshold voltage. The NVDRAM then returns to DRAM read operation for reading out the non-volatile datum stored in the correspondent non-volatile MOSFET 205.

BRIEF DESCRIPTION OF THE DRAWINGS

For a better understanding of the present invention and to show how it may be carried into effect, reference will now be made to the following drawings, which show the preferred embodiments of the present invention, in which:

FIGS. 5(a)-(b) illustrate the non-volatile datum in the non-volatile NMOSFET loaded into the DRAM cell according to FIG. 2.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1:
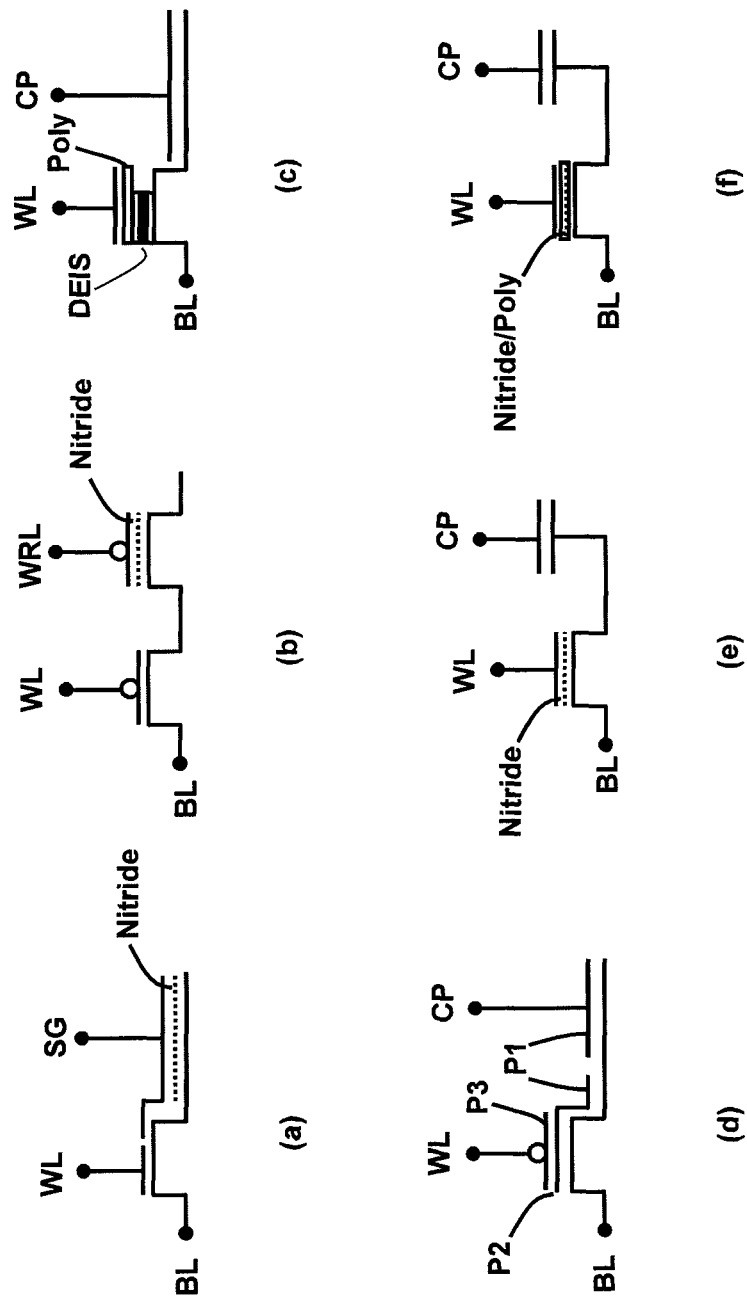
FIGS. 1(a)-(f) show NVDRAM schematics in prior arts.
Figure 2:
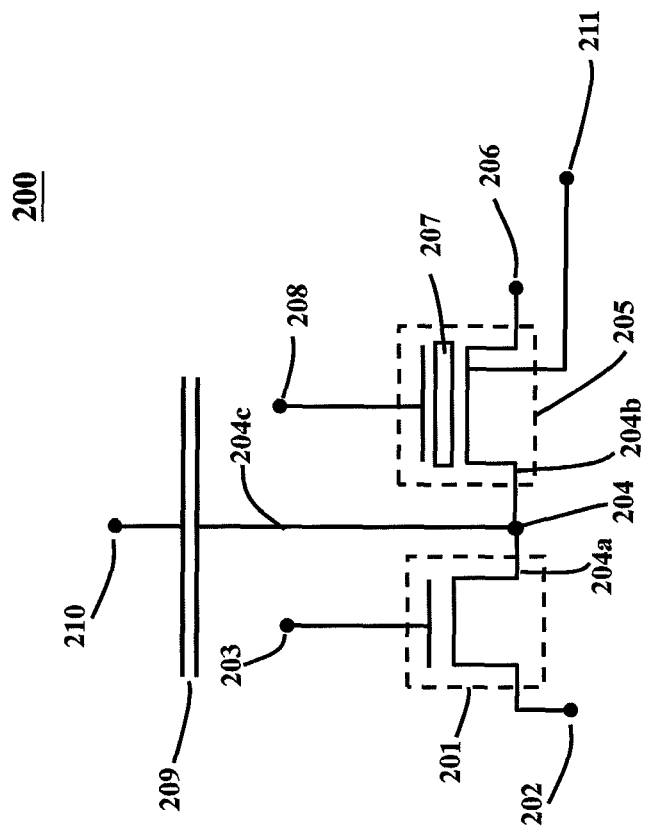
FIG. 2 shows the schematic of NVDRAM according to an embodiment of the present invention.
Figure 3A:
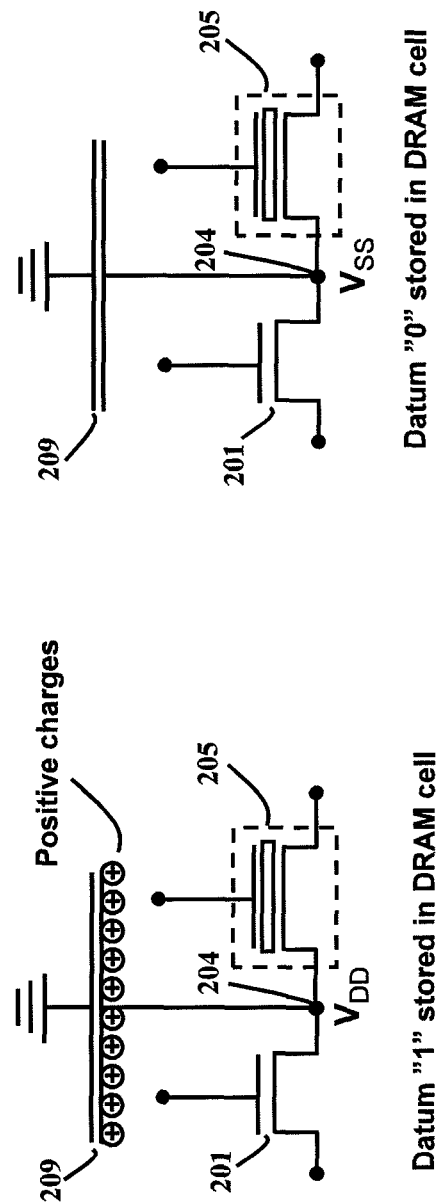
FIGS. 3(a)-(c) show the embodiment of NVDRAM with (a) digital definition of DRAM signals, and (b) and (c) the non-volatile datum definition of non-volatile MOSFET according to an embodiment of the present invention.
Figure 3B:
Figure 3C:
Figure 4A:
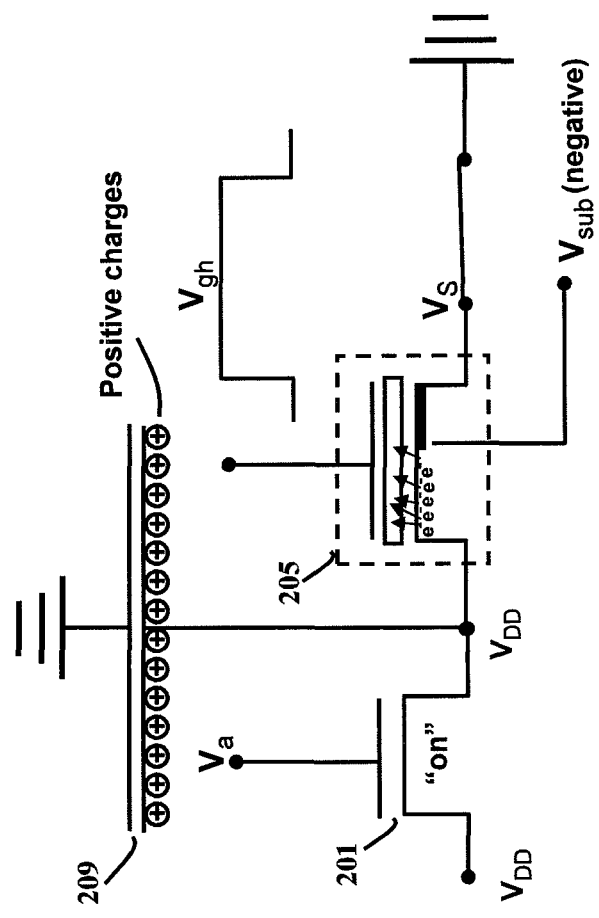
FIGS. 4(a)-(b) illustrate the non-volatile MOSFET programming scheme of storing operation for (a) DRAM with datum "1" (b) DRAM with datum "0" for NVDRAM according to an embodiment of the present invention.
Figure 4B:
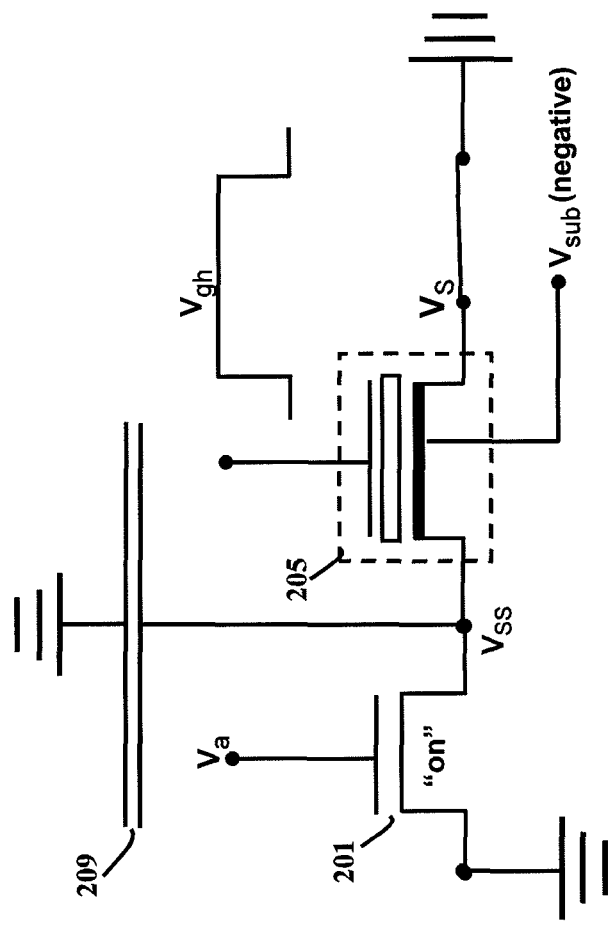
Figure 6:
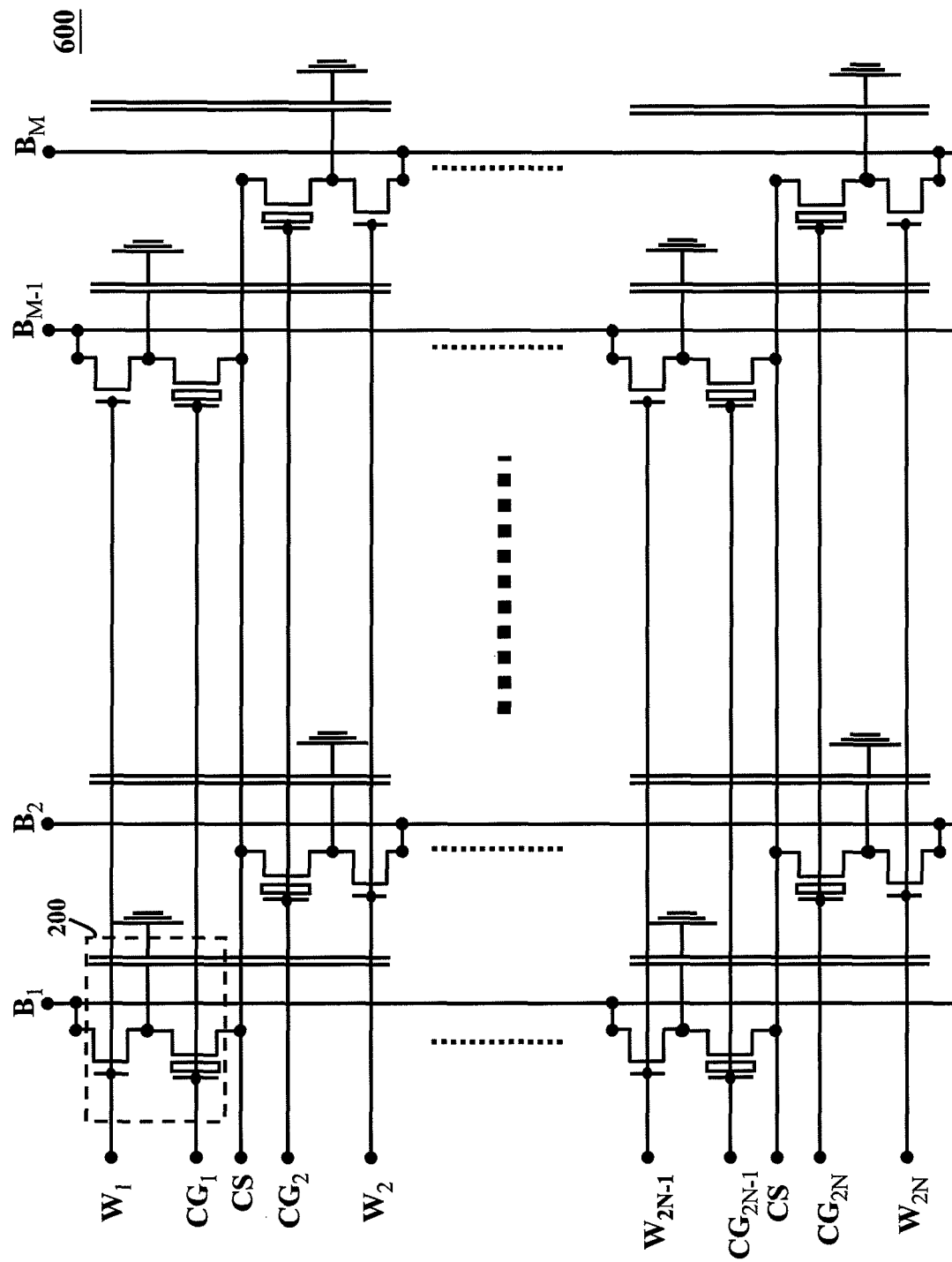
FIG. 6 shows an array view of the NVDRAM schematic according to an embodiment of the present invention.

For the embodiment of the NVDRAM, we incorporate a plurality of NVDRAM cells 200 shown in FIG. 2 into a memory cell array 600. As depicted in FIG. 6, M×N NVDRAM cells are disposed to form staggered even-odd paired cells along the M bitlines and accessed by 2N wordlines as the popular folded DRAM cell array architectures. The gates of a row of M/2 low voltage access transistors are connected horizontally to form a single wordline. The source electrodes of a column of N low voltage access transistors are attached to a vertical bitline. As for a NOR-type flash memory cell array, the control gates of a row of M/2 non-volatile MOSFETs are connected to form a control gate line CG. The source electrodes of paired rows of M/2 non-volatile MOSFETs are jointed to form a common source line CS. As the conventional DRAM, the common plates 210 of the storage capacitors 209 in NVDRAM cells are connected altogether to form a singe common electrode in the array. The common plate is a single conducting plate in the stacked capacitor structures or a conducting silicon substrate in the deep trench capacitor structures. Depending on the various DRAM read schemes, the common plates are either connected to a ground voltage or half of the low operating voltage (i.e., $V_{DD}/2$) as conventional DRAM cells operate. The storage node 204 of NVDRAM cell in FIG. 2 is the only internal node inside the memory cell. Finally, each M-column and 2N-row NVDRAM folded cell array 600 contains M x N NVDRAM cells, 2N wordlines, 2N control gate lines (CG), M bitlines, and N common source (CS) lines as shown in FIG. 6. Please be noted that the M-column and 2N-row NVDRAM folded cell array in FIG. 6 is provided by way of explanation, and not limitations of the invention.

Figure 7:
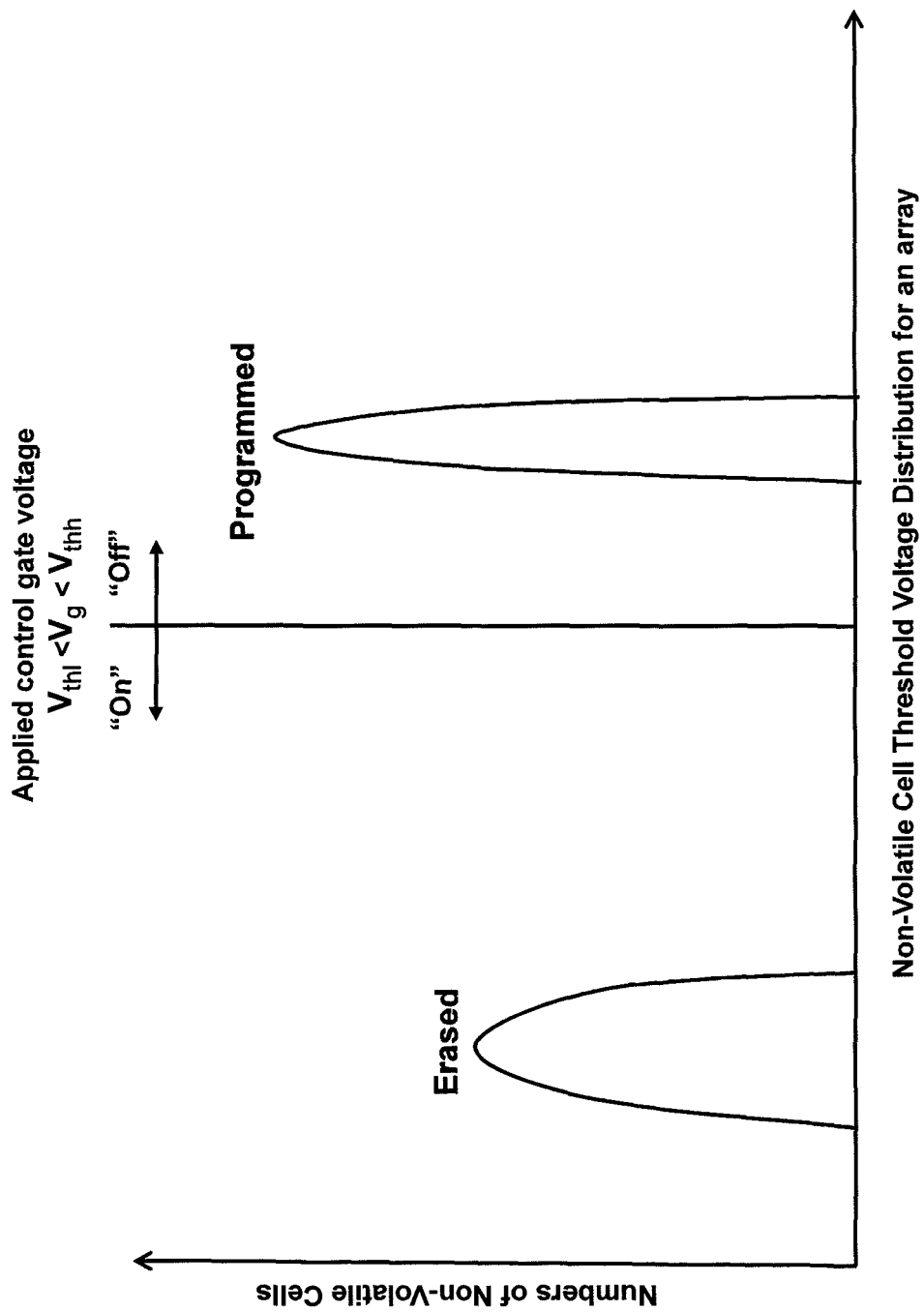
FIG. 7 shows a typical threshold voltage distribution of program/erase for non-volatile memory cells in an array according to an embodiment of the present invention.

The NVDRAM cell array 600 can be operated in dynamic memory modes and non-volatile memory mode. The operations of dynamic memory modes are the same as read, write, and refreshment as in DRAM standard operation. They are known to people in the skill. We will not address in detail. The operations of non-volatile memory modes contain "load" and "store" modes. "Load" mode is the operation of loading non-volatile data from the non-volatile cell 205 into the DRAM cell while "store" mode is the operation of storing data from DRAM cell into the non-volatile memory cell 205. Before the non-volatile memory cell array 600 is ready for storing non-volatile datum, the non-volatile cells 205 in the array are required to be erased to a low threshold voltage. Fowler-Nordheim tunneling most common method used in the flash memory array is applied to erase the NVDRAM cell array 600. It is done by applying a voltage bias $V_g$ less or equal to zero volts to all the 2N control gate lines and a voltage bias $V_{sub}$ greater than zero volts to the array substrate 211 such that the applied electric field is able to tunnel the electrons out of the charge storing material to the substrates. The threshold voltages of the non-volatile memory cells in the array are erased to a low threshold voltage distribution as illustrate in FIG. 7. A control gate voltage $V_g$ greater than the group of non-volatile memory cells with erased threshold voltages and less than the group of non-volatile memory cells with the programmed threshold voltages turns "on" and "off" the non-volatile memory cells in the array, respectively.

Figure 8:
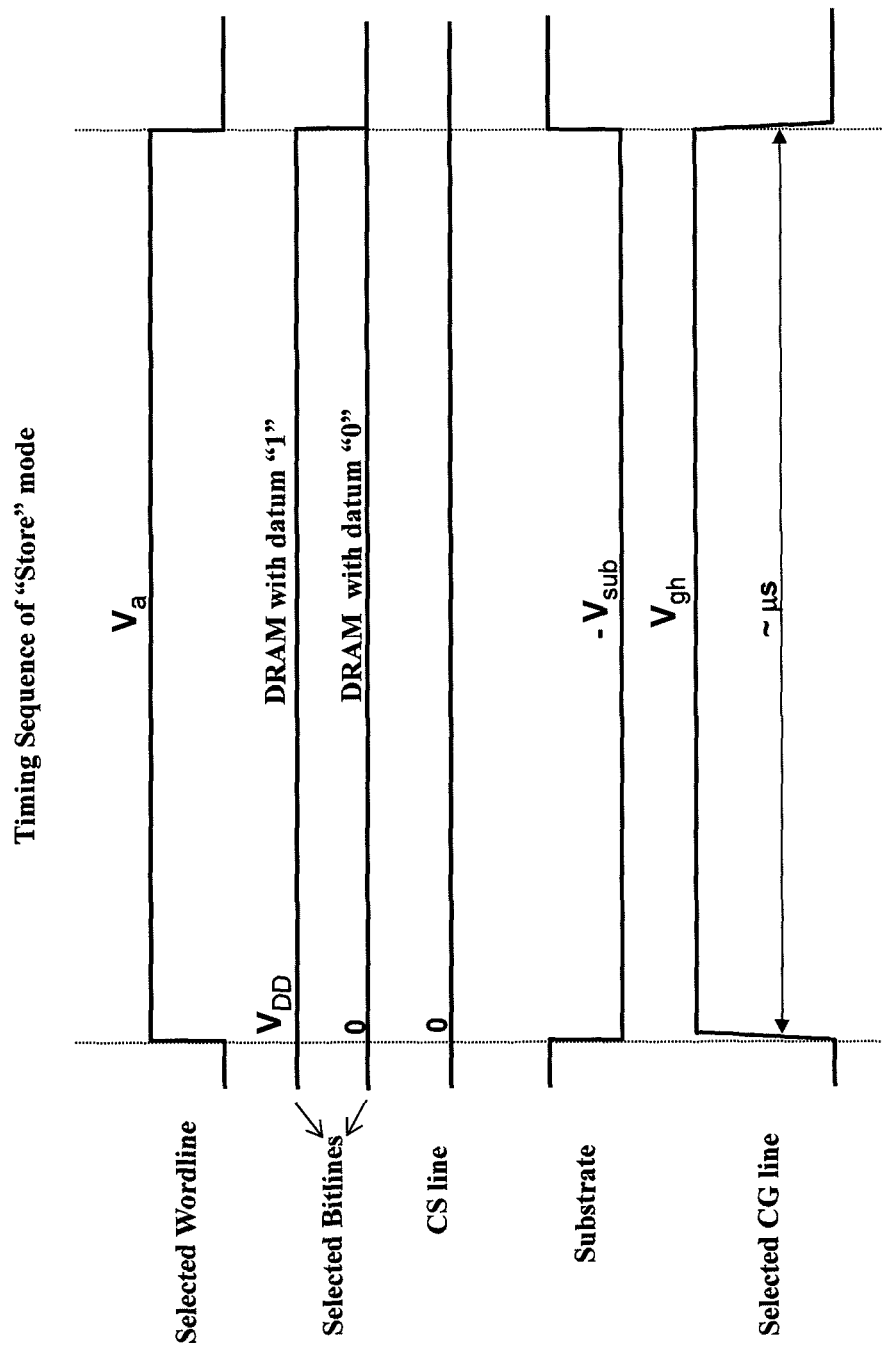
FIG. 8 shows the applied voltages timing sequence for storing DRAM data to the correspondent non-volatile memory cell in the NVDRAM array according to an embodiment of the present invention.

In the "store" mode, the data in DRAM cells is stored into its correspondent non-volatile memory cell 205. In the array 600, one row of NVDRAM cells can be selected for the operation. The applied voltage timing sequence for the selected wordline, bitlines, control gate (CG) line, common source (CS) line, and substrate is shown in FIG. 8. To sustain the voltages $V_{DD}$ or $V_{SS}$ at the storage nodes 204 for programming the row of non-volatile memory cells, the DRAM write drivers for refreshment can be turned on to bias the correspondent bitlines, while the selected wordline is activated by applying a voltage bias $V_a$. The programming process takes place, when a high voltage pulse with amplitude $V_{gh}$ and several µs duration is applied to the control gate line. For the DRAM "1" cells with storage voltage $V_{DD}$ in the selected row, the programming process injects hot electrons to the charge storing material to shift the threshold voltages of the corresponding non-volatile cells to higher threshold voltages. For the DRAM"0" cells with storage voltage $V_{SS}$ in the selected row, the programming process does not occur resulting in no threshold voltage shifts of the corresponding non-volatile memory cells. The non-volatile memory cells with DRAM "0" cells remain their erased threshold voltages.

The states of "high" and "low" threshold voltages of non-volatile memory cells represent the non-volatile data of "1" and "0", respectively. The DRAM data are directly stored into their correspondent non-volatile memory cells by changing the two states of "high" and "low" threshold voltages of the non-volatile memory cells.

Figure 9:
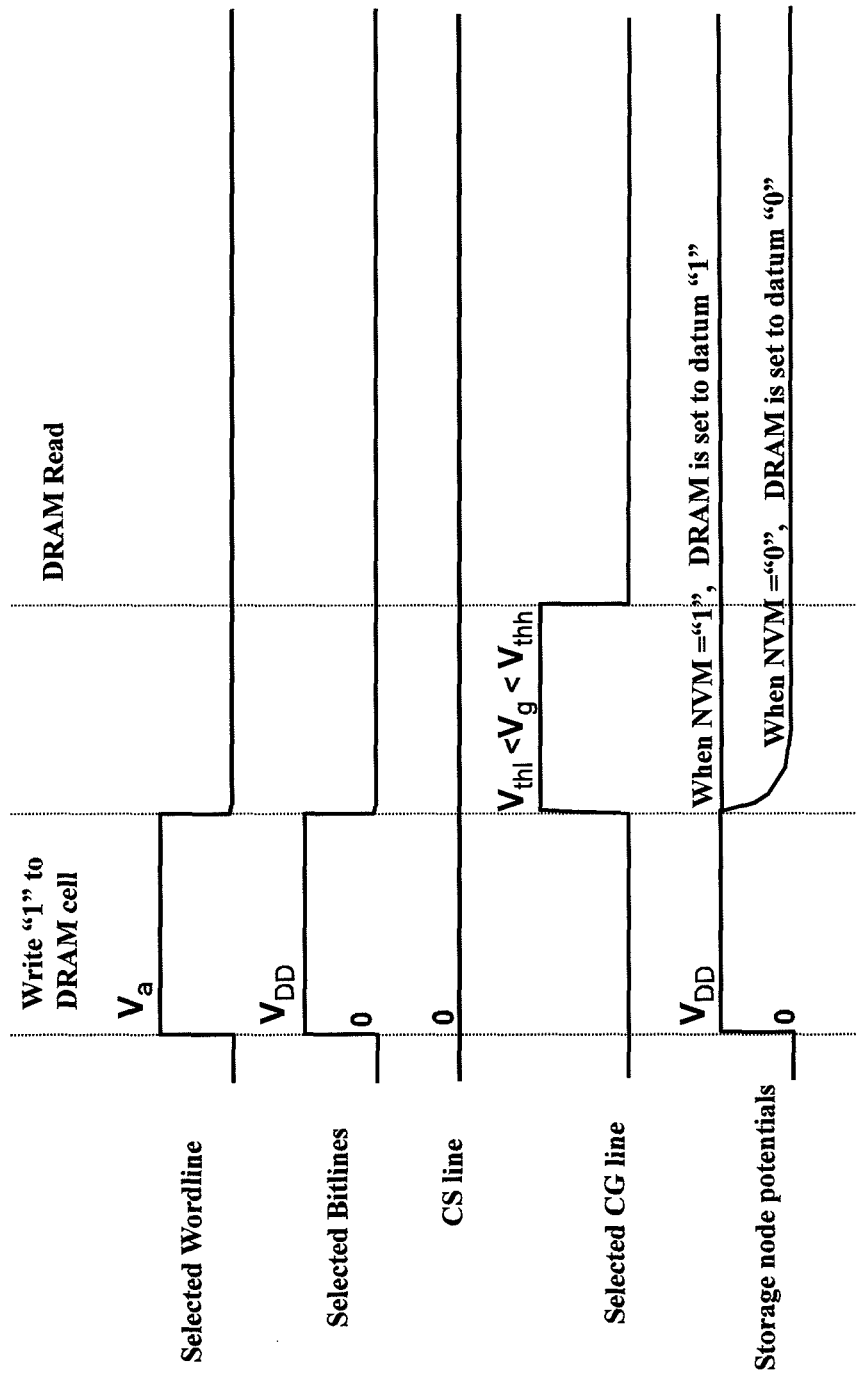
FIG. 9 shows the applied voltage timing sequence for loading NVM data to DRAM cell and reading out by DRAM according to an embodiment of the present invention.

In the "load" mode, the stored non-volatile data in the non-volatile memory cells are loaded back to the DRAM cells. In the array 600, one row of NVDRAM cells can be selected for the "load" operation. The applied voltage timing sequence for the selected wordline, bitlines, control gate (CG) line, common source (CS) line, and the voltage potentials at the storage nodes 204 is shown I FIG. 9. In the timing sequence, the selected row of NVDRAM cells is written with DRAM data "1" as the conventional DRAM write process. The voltage potentials at the storage nodes 204 in the cells are charged to $V_{DD}$. After the selected DRAM cells are turned off by applying a voltage close to the ground voltage to the selected wordline, the selected non-volatile memory cells are turned on by applying a gate voltage $V_g$ to the control gate line, where $V_{thl} < V_g < V_{thh}$. The common source line CS is connected to the ground voltage. For the low threshold voltages of non-volatile memory cells (storing a non-volatile datum of "0") in the selected row, the voltages at the storage nodes drop to ground voltage as the non-volatile memory cells are turned on to discharge the storage capacitors 209. While for the high threshold voltages of non-volatile memory cells (storing a non-volatile datum of "1") in the selected row, the voltages at the storage nodes remain the same as the non-volatile memory cells are "off". The data in the selected row of the DRAM cells after the loading sequence are the identical copy of the non-volatile data stored in the correspondent non-volatile memory cells, respectively. Then the non-volatile data can be read out by the usual DRAM read.

In the NVDRAM cell array 600, the datum in the NVM cells can be directly loaded into the corresponding DRAM cells without applying intermediate data amplification and buffering leading to high speed non-volatile data access. The NVDRAM cell of the invention can provide both fast read/write function for dynamic memory and non-volatile memory storage in one unit memory cell.

In summary, we have disclosed new NVDRAM and methods of operations. The NVDRAM cells of the invention have the same read/write performance of DRAM with fast load/store non-volatile memory capability.

What is claimed is:
1. A non-volatile dynamic random access memory (NVDRAM) cell, comprising:
  a non-volatile memory (NVM) element having a charge storing material, a control gate electrode, a first source electrode, a first drain electrode and a substrate electrode; and
  a DRAM element comprising:
    an access transistor having a gate electrode, a second source electrode and a second drain electrode; and
    a storage capacitor having a first plate electrode and a second plate electrode;
  wherein the first plate electrode, the first drain electrode and the second drain electrode form a storage node.

2. The NVDRAM cell according to claim 1, which functions as a conventional DRAM element when the NVM element is turned off.

3. The NVDRAM cell according to claim 1, wherein when the NVM element is in a low threshold voltage state, it indicates the NVM element stores a data bit of 0, and wherein when the NVM element is in a high threshold voltage state, it indicates the NVM element stores a data bit of 1.

4. The NVDRAM cell according to claim 1, wherein when the storage node carries a low operating voltage, it indicates the DRAM element stores a data bit of 1, and wherein when the storage node carries a ground voltage, it indicates the DRAM element stores a data bit of 0.

5. The NVDRAM cell according to claim 1, wherein the second plate electrode is biased to a ground voltage or half of a low operating voltage.

6. The NVDRAM cell according to claim 1, wherein the NVDRAM cell forms a cell of a NVDRAM cell array.

7. A method of loading a data bit stored in a NVM element into a DRAM element in a NVDRAM cell, the NVM element having a charge storing material, a control gate electrode, a first source electrode, a first drain electrode and a substrate electrode, the DRAM element comprising an access transistor and a storage capacitor, the access transistor having a gate electrode a second source electrode and a second drain electrode, the storage capacitor having a first plate electrode and a second plate electrode, wherein the first plate electrode, the first drain electrode and the second drain electrode form a storage node, the second plate electrode being biased to a reference voltage, the method comprising the sequential steps of:
  charging the storage capacitor to a low operating voltage;
  turning off the access transistor;
  coupling the first source electrode of the NVM element to a ground terminal; and
  applying a voltage bias $V_g$ to the control gate electrode of the NVM element;
  wherein $V_{thl} < V_g < V_{thh}$, and $V_{thl}$ and $V_{thh}$ respectively denote a low threshold voltage and a high threshold voltage of the NVM element;
  wherein when the NVM element is in the low threshold voltage state, the NVM element is turned on to discharge the storage capacitor to cause the storage node to have a around voltage during the step of applying the voltage bias; and
  wherein when the NVM element is in the high threshold voltage state the NVM element is turned of to maintain the low operating voltage at the storage node during the step of applying the voltage bias $V_g$ to the control gate electrode.

8. The method according to claim 7, further comprising:
  applying a ground voltage to the control gate electrode of the NVM element after the step of applying the voltage bias $V_g$ to the control gate electrode.

9. The method according to claim 8, further comprising:
  isolating the ground voltage from the control gate electrode and the first source electrode of the NVM element after the step of applying the ground voltage.

10. The method according to claim 7, wherein the step of charging comprises:
  turning on the access transistor and supplying the low operating voltage to the second source electrode of the access transistor to thereby charge the storage capacitor to the low operating voltage.

11. The method according to claim 7, wherein the reference voltage is a ground voltage or half of the low operating voltage.

12. A method of storing a data bit of a DRAM element into a NVM element in a NVDRAM cell, the NVM element having a charge storing material, a control gate electrode, a first source electrode, a first drain electrode and a substrate electrode, the DRAM element comprising an access transistor and a storage capacitor, the access transistor having a gate electrode a second source electrode and a second drain electrode, the storage capacitor having a first plate electrode and a second plate electrode, wherein the first plate electrode, the first drain electrode and the second drain electrode form a storage node, the second plate electrode being biased to a reference voltage, the method comprising the sequential steps of:
  erasing the NVM element to a low threshold voltage state; and
  programming the NVM element;
  wherein the step of programming the NVM element comprises:
  providing the storage node with one of a ground voltage and a low operating voltage; and
  respectively applying a high voltage bias, the ground voltage and a negative voltage to the control gate electrode, the first source electrode and the substrate electrode of the NVM element to cause the NVM element to have a corresponding threshold voltage in accordance with the voltage at the storage node.

13. The method according to claim 12, wherein after the step of respectively applying the high voltage bias, the ground voltage and the negative voltage, the NVM element is programmed to a high threshold voltage state when the storage node carries the low operating voltage, and wherein the NVM element remains in the low threshold voltage state when the storage node carries the ground voltage.

14. The method cell according to claim 13, wherein when the NVM element is in a low threshold voltage state, it indicates the NVM element stores a data bit of 0, and wherein when the NVM element is in a high threshold voltage state, it indicates the NVM element stores a data bit of 1.

15. The method according to claim 12, wherein the reference voltage is the ground voltage or half of the low operating voltage.

16. A memory cell array, comprising:
  a plurality of non-volatile dynamic random access memory (NVDRAM) cells disposed in rows and columns, the NVDRAM cells being arranged every other row in a column direction and every other column in a row direction, each NVDRAM cell comprising;
  a non-volatile memory (NVM) element having a charge storing material, a control gate electrode, a first source electrode, a first drain electrode and a substrate electrode; and
  a DRAM element comprising:
    an access transistor having a gate electrode, a second source electrode and a second drain electrode; and
    a storage capacitor having a first plate electrode and a second plate electrode, wherein the first plate electrode, the first drain electrode and the second drain electrode form a storage node;
  a plurality of bit lines for connecting the second source electrodes of each column of the cells of the memory cell array;
  a plurality of word lines for connecting the gate electrodes of each row of the cells of the memory cell array;
  a plurality of control gate lines for connecting the control gate electrodes of each row of the cells of the memory cell array; and
  a plurality of common source lines, each connecting the first source electrodes of two adjacent rows of the cells of the memory cell array, such that row-adjacent cell-pairs share a common source line;
  wherein the common source lines are connected to a ground terminal.

17. The memory cell array according to claim 16, which functions as a conventional DRAM cell array when the NVM elements are turned off.

18. The memory cell array according to claim 16, wherein when one NVM element is in a low threshold voltage state, it indicates the NVM element stores a data bit of 0, and wherein when one NVM element in a high threshold voltage state, it indicates the NVM element stores a data bit of 1.

19. The memory cell array according to claim 16, wherein at the beginning of a store mode, a plurality of selected NVM elements associated with a selected word line are initially in a low threshold voltage state.

20. The memory cell array according to claim 19, wherein at the end of the store mode, a selected NVM element is programmed to a high threshold voltage state when its corresponding storage node carries a low operating voltage, and wherein a selected NVM element remains in the low threshold voltage state when its corresponding storage node carries a ground voltage.

21. The memory cell array according to claim 16, wherein at the beginning of a load mode, a plurality of selected access transistors associated with a selected word line are turned on and a plurality of selected storage capacitors associated with the selected word line are initially charged to a low operating voltage.

22. The memory cell array according to claim 21, wherein in the load mode, with the selected access transistors being off, the selected NVM elements in the low threshold voltage state are turned on to discharge their corresponding storage capacitors to cause their corresponding storage nodes to have a ground voltage after the selected storage capacitors nodes are initially charged to the low operating voltage.

23. The memory cell array according to claim 21, wherein in the load mode, with the selected access transistors being off, the selected NVM elements in the high threshold voltage state are turned off to maintain the low operating voltage at their corresponding storage nodes after the selected storage capacitors are initially charged to the low operating voltage.

24. The memory cell array according to claim 16, wherein the second plate electrodes of the storage capacitors of all the cells form a single common electrode in the memory cell array.

25. The memory cell array according to claim 16, wherein the second plate electrodes of the storage capacitors of all the cells are biased to a ground voltage or half of a low operating voltage.

* * * * *